United States Patent [19]
Peters, Jr.

[11] 3,876,924

[45] Apr. 8, 1975

[54] IMPROVED GATING CIRCUIT FOR THYRISTOR POWER SUPPLY

[75] Inventor: Philip H. Peters, Jr., Greenwich, N.Y.

[73] Assignee: Enviroment One Corporation, Schenectady, N.Y.

[22] Filed: Mar. 12, 1973

[21] Appl. No.: 340,340

Related U.S. Application Data

[62] Division of Ser. No. 245,924, April 20, 1972.

[52] U.S. Cl............ 321/43; 307/252 N; 323/22 SC; 321/18; 321/44

[51] Int. Cl........................................... H02m 1/08

[58] Field of Search....... 321/43, 44, 18; 307/252 J, 307/252 N, 252 UA; 323/22 SC

[56] References Cited

UNITED STATES PATENTS

| | | | |
|---|---|---|---|
| 3,597,675 | 8/1971 | Peek et al. | 323/22 SC X |
| 3,614,596 | 10/1971 | Ford, Jr. et al. | 307/252 N X |
| 3,767,940 | 10/1973 | Herzog et al. | 307/252 N X |

*Primary Examiner*—R. N. Envall, Jr.
*Attorney, Agent, or Firm*—Charles W. Helzer

[57] ABSTRACT

An improved gating control circuit for gate controlled thyristor power supplies comprising a programmable uni-junction transistor having an anode, an anode-gate and a cathode, a timing capacitor connected in parallel circuit relationship across the anode-cathode of the programmable uni-junction transistor, and an output circuit coupled in series circuit relationship with the programmable uni-junction transistor for supplying a gating-on signal to the control gate of a gate controlled power thyristor. An adjustable charging resistor is connected in common to the anode of the programmable uni-junction transistor and to the timing capacitor and an anode-gate biasing resistor is connected across the series connected charging resistor and programmable uni-junction transistor with an intermediate point of the biasing resistor connected to the anode-gate of the programmable uni-junction transistor. A power supply terminal is connected across the biasing resistor for supplying the gating control circuit with low voltage direct current excitation potential.

9 Claims, 20 Drawing Figures

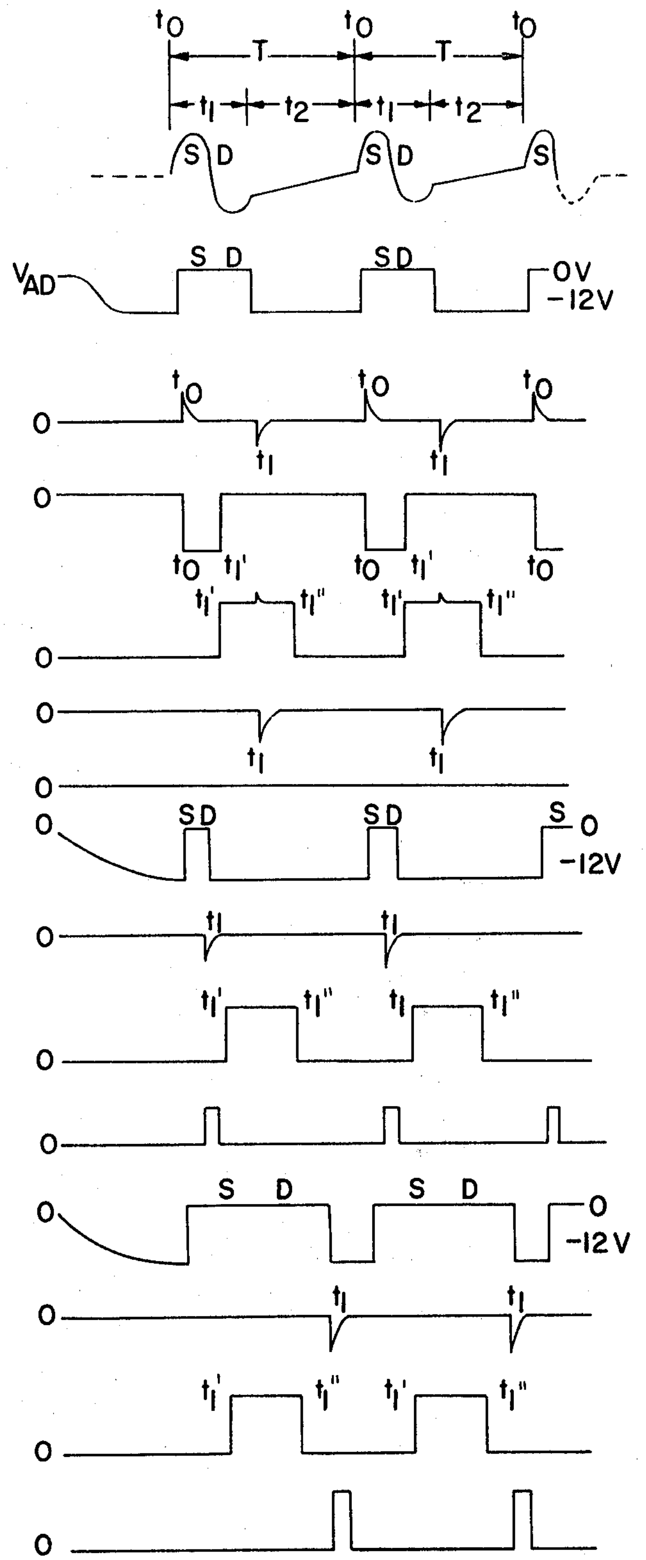
FIG. 3(a), FIG. 3(b), FIG. 3(c), FIG. 3(d), FIG. 3(e), FIG. 3(f), FIG. 3(g), FIG. 3(h), FIG. 3(i), FIG. 3(j), FIG. 3(k), FIG. 3(l), FIG. 3(m), FIG. 3(n), FIG. 3(o)

IMPROVED GATING CIRCUIT FOR THYRISTOR POWER SUPPLY

This is a division of application Ser. No. 245,924, filed Apr. 20, 1972.

BACKGROUND OF INVENTION

1. Field of Invention

This invention relates to a new and improved induction heating and cooking apparatus of the type using an inductive heating coil excited with high frequency electric currents for inductively heating pans or other similar cooking vessels placed in proximity to the coil.

More particularly, the invention relates to such an inductive cooking apparatus and power supply therefore having an improved pan safety control for sensing whether a pan or other cooking vessel placed over the induction heating coil of the apparatus is composed of a suitable material which allows the apparatus to operate properly and safely, and if not, then shuts down the apparatus thereby notifying the operator that the pan is not suitable for use with an inductive cooking apparatus, and should be removed.

2. Prior Art Situation

In U.S. application Ser. No. 131,648- filed Apr. 6, 1971, entitled "Metal Base Cookware Induction Heating Apparatus Having Improved Power Supply and Gating Control Circuit Using Infra-Red Temperature Sensor and Improved Heating Coil Arrangement"- Philip H. Peters, Jr.-inventor-assigned to the Environment/One Corporation-applicant has described a novel metal base cookware induction heating apparatus having an improved power supply comprised by a chopper inverter circuit using a shunt fed single SCR feedback-/diode pair and series connected inductor and capacitor commutating components for converting direct current potential to a high frequency pulsating excitation potential that is supplied to an induction heating coil that comprises a component of the chopper inverter circuit. In this chopper inverter circuit, the gating pulse that is applied to the control gate of the chopper SCR/feedback diode pair is developed by a self-excited $t_2$ timer circuit operating off of the supply terminal buses supplying the SCR chopper inverter. The SCR chopper inverter is designed to operate at some preset $t_1$ commutation time determined by the value of the commutating components of the circuit, and the trigger gating pulse developed by the $t_2$ timer gating circuit, is developed after a fixed period $t_2$ following each conduction interval of the SCR-feedback diode pair. Thus, the repetition time or rate T of the chopper inverter circuit is given by the expression $T = t_1 + t_2$ and varies directly with variations either in $t_1$ or $t_2$. For a given SCR there is a set of concurrent ratings at a given SCR device temperature which determine the time of the commutation period below which the SCR will fail to turn-off. For example, there are a number of SCR devices on the market which at normal room temperature require that the current through the device be below a nominal holding current value for at least a period of 15 – 30 microseconds in order for the device to turn-off and retain its current blocking capability. If this minimum turn-off period is not provided for either in the design of a circuit or in its subsequent operation, the SCR will fail to turn-off (fail to commutate), and give rise to the development of quite large currents flowing through the device in excess of the device rating which can possibly destroy the device.

It has been recognized by the inventor that when a copper or aluminum or other pan or cooking vessel fabricated of high conductivity metal, is placed over the inductive heating coil of an induction heating apparatus such as that described in the above mentioned pending U.S. application, the high electrical conductivity of the pan or other cooking vessel greatly reduces the inductive reactance of the inductive heating coil. This is in contrast to stainless steel, titanium, iron and other lossy metal materials which effect only a slight change in the inductance of the inductive heating coil and serve to introduce primarily a resistance in series with the coil. If the pan load imposed on the inductive heating coil reduces the commutation period of the overall chopper-inverter system including the inductive heating coil below that which assures the SCR an adequate minimum turn-off time, the SCR will remain on and the input current to the chopper-inverter will rise to a very high value at the peak of the line voltage. In the case of the above-noted circuit, the current will be limited only in magnitude by the series choke coil $L_2$ employed in the circuit. In such event the main breaker, fuse or other protective element included in the line supplying the chopper-inverter, will trip and disconnect the chopper-inverter from the input supply line. However, in any such failure, large transients of current are developed as the stored energy in the inductive circuit is dissipated, and it is possible to destroy the SCR in the process. In order to overcome this problem, the present invention was devised.

SUMMARY OF INVENTION

It is therefore a primary object of this invention to provide a new and improved inductive cooking apparatus and power supply therefore having a pan safety control which senses whether a particular pan or other cooking vessel placed over the inductive heating coil of the apparatus is fabricated from a high conductivity material such as aluminum or copper, and if so, operates to shut down the inductive cooking apparatus until the pan is removed by the operator.

Another object of the invention is to provide such an inductive cooking apparatus having a power supply and pan safety control which may be reset readily by an operator of the unit, but which also helps to school the operator to recognize that a particular pan which he or she is using, is made of a high conductivity metal such as copper or aluminum that should not be used with the inductive cooking apparatus.

Still another object of the invention is to provide both low power (115v.) and high power (230v.) models of an inductive cooking apparatus, power supply and pan safety control having the above capabilities which are fast responding and work under either of the following conditions:

Case I — The chopper-inverter power supply of the inductive cooking apparatus is turned-on and running and a high conductivity pan of aluminum, copper, etc. is brought into proximity with the inductive heating coil by the operator; or Case II — The high conductivity pan is disposed over the inductive heating coil upon initial turn-on of the inductive cooking apparatus chopper-inverter.

A further object of the invention is the provision of an inductive cooking apparatus having the above characteristics, and which also include an over-temperature sensor and cutoff control that utilizes a common reset connection with the pan saftey control whereby operation of the common reset connection readily can reset the apparatus to condition it for renewed operation irrespective of whether it was shut down because of the prior use of an improper pan or over-temperature;

A still further object of the invention is to provide an induction cooking apparatus and improved power supply therefore having a pan safety control which is relatively simple to construct, operate and service and is relatively inexpensive so that it can be employed as a kitchen range in home use.

BRIEF DESCRIPTION OF DRAWINGS

These and other objects, features and many of the attendant advantages of this invention will be appreciated more readily as the same becomes better understood by reference to the following detailed description, when considered in connection with the accompanying drawings, wherein like parts in each of the several Figures are identified by the same reference character, and wherein:

FIGS. 3(*a*) through 3(*m*) illustrate a series of voltage versus time characteristic wave shapes produced at different points in the circuit of FIG. 2 during the operation thereof.

DETAILED DESCRIPTION OF PREFERRED EMBODIMENTS

Figure 1:
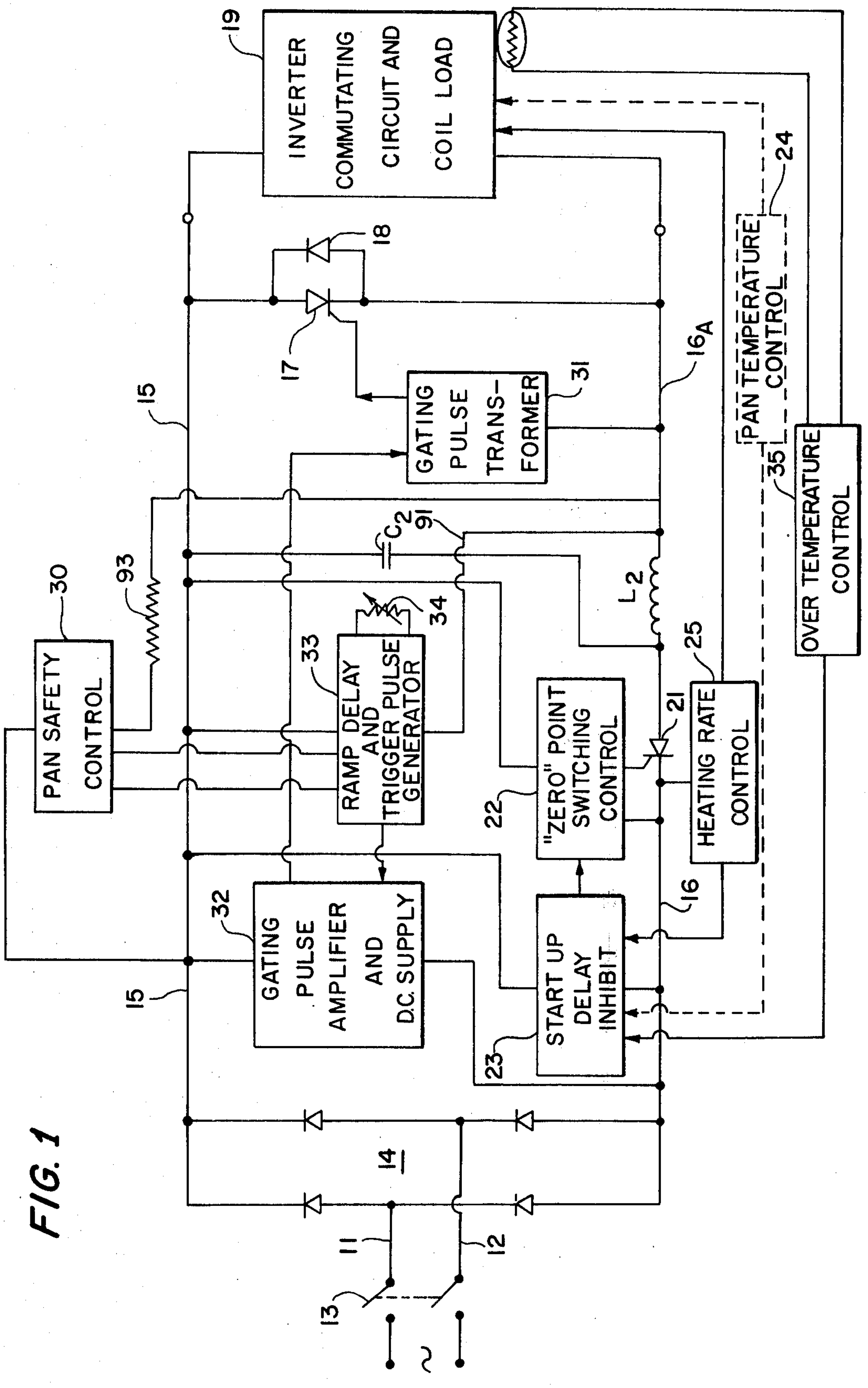
FIG. 1 of the drawings is a functional block diagram of a new and improved induction heating and cooking apparatus having a pan safety control constructed in accordance with the invention.

FIG. 1 is functional block diagram of a new and improved induction cooking unit chopper-inverter power supply circuit including a pan safety control constructed in accordance with the invention. The circuit of FIG. 1 is intended to be energized from a conventional commercial or residential 115 volt, 15–20 amp, 60 cycles per second, alternating power supply connected to the power supply terminals 11 and 12 through a conventional fuse plug or a circuit breaker such as 13 preferably having a fast response time to assure protection for the overall system. The alternating current power supply terminals 11 and 12 are connected to a full wave rectifier 14 of conventional construction having its output connected across a pair of relatively high voltage (115 volts) direct current power supply terminal means 15 and 16. It should be noted at this point that while the circuit being described is intended primarily for use at the lower voltage rating of 115 volts, 15–20 amps, it may readily be adapted for use at higher voltages such as 220–230 volts, 20–30 amps, by appropriate modification to include high voltage rated power switching devices as will be described hereinafter in connection with FIG. 4. The output from the full wave rectifier 14 is unfiltered, and hence the potential appearing across the direct current power supply terminals 15 and 16, while unidirectional, is in the form of a series of sinusoidal-shaped, half wave rectified high voltage pulses that drop substantially to zero value intermediate each half wave pulse and have a frequency on the order of 120 cycles per second or approximately double the frequency of the alternating current supply connected to the input supply terminals 11 and 12.

The full wave rectifier 14 supplies the full wave rectified excitation potential for a chopper inverter circuit comprised by a filter inductor $L_2$, a filter capacitor $C_2$, a bidirectional conducting, gate controlled conductivity control, semiconductor thyristor switching device formed by a power rated silicon control rectifier 17 and reversely poled, parallel connected feedback diode 18. The silicon control rectifier 17 (hereinafter referred to as a SCR) and feedback diode 18 are connected across, and serve to excite at a relatively high excitation frequency (of the order of 20–30 kilocycles per second) chopper-inverter circuit commutating components 19 to be described more fully hereinafter in connection with FIG. 2 of the drawings. A conventional resistor-capacitor snubbing network for reducing dv/dt effects on the SCR 17 (not shown in FIG. 1), also may be connected across the SCR 17 and feedback diode 18. Energization of the chopper-inverter circuit takes place through the filter capacitor $C_2$, and filter inductor $L_2$ which preferably is connected in the direct current power supply terminal 16, but alternately could be connected in the power supply terminal 15. However, the preferred location of the inductor $L_2$ is as shown in FIGS. 1 and 2 whereby the SCR 17 anode and diode 18 may be connected to the positive terminal 15 in order to minimize capacitive voltage coupling effects to the heat sinks provided for these devices.

Energization of the high frequency chopper-inverter power supply circuit takes place only during intervals while a self-starting, zero point energization switching means in the form of a zero point switching SCR 21, is conductive. The zero point switch comprised by SCR 21 is rendered conductive by a zero point sensing turn-on control 22 that in turn is controlled by a start-up delay inhibit circuit 23 which in turn is under the control of a heating rate control 25, and over-temperature control 35, and if provided, a pan temperature control 24 or other similar control. The heating rate control 25 operates to adjust the power level at which power is produced by the chopper-inverter power supply circuit that in turn supplies the high frequency pulses of electrical energy for exciting the inductive heating coil that comprises a component of the chopper-inverter power supply commutating circuit, and that serves to inductively heat metal based cookware or other objects disposed over the heating coil. The heating rate control 25 operates to establish the power level or rate at which heat will be produced by the inductive heating coil in the metal based cookware. The pan temperature control 24 (if used) directly senses the temperature of the metal based cookware being inductively heated by the inductive heating coil, and thereafter develops an on-off control signal which controls operation of the start-up delay inhibit circuit 23. Low voltage direct current excitation power to operate the pan temperature control 24 and over-temperature control 35 is obtained directly from the output of full wave rectifier 14 as will be explained more fully hereinafter in connection with FIG. 2.

The soft start, zero-point switching SCR 21 does not, itself, directly control gating-on of the chopper-inverter SCR 17, but only serves to enable operation of the chopper-inverter by controlling application of the high voltage, unidirectional excitation potential from full wave rectifier 14 across the chopper-inverter power supply terminals 15 and 16A. Thus, the voltage appearing across power supply terminals 15 and 16 may or may not be present across power supply terminals 15 and 16A dependent upon whether zero point switch SCR 21 is conducting or not. The purpose of the soft start, zero point switching control 22 is to assure that energization potential is supplied across SCR 17 only at or near the beginning of the rectified, substantially unfiltered, sinusoidally-shaped, half wave rectified high voltage pulses appearing at the output of full wave rectifier 14. In this manner, surge charging of the filter capacitor $C_2$ and the commutating components of the chopper-inverter circuit with initial high voltages, is avoided.

One of the undesirable consequences avoided by the use of the zero point switching SCR 21, is possible misfiring of the chopper-inverter SCR 17 due to the lack of a sufficient gating-on signal at a desired turn-on point. This feature also assures that the rate at which the applied voltage increases, is always limited to a value which assures that the energy stored in the commutating circuit components 19 will always be sufficient to commutate the SCR 17 and diode 18 under all conditions of loading. This latter condition requires that the commutating current flowing in the commutating components be several fold greater than the current $I_2$ flowing through the inductor $L_2$ at the moment of commutation. A too rapid application of a supply voltage (such as might occur if the circuit were initially turned-on at a point corresponding to the peak output voltage from the full wave rectifier 14), could result in a charging current $I_2$ through the conductor $L_2$ which would be larger than the available commutating current from the commutating components 19, and would result in SCR 17 failing to turn-off. By appropriate design of the start-up delay inhibit 23 and the zero point switching control 22, proper delays are provided so as to assure proper gating-on and commutation-off of the chopper-inverter switching SCR 17 at all times including initial start-up of the circuit and under varying load conditions.

Gating-on of the chopper-inverter switching SCR 17 is achieved through the medium of a gating pulse transformer 31 whose secondary winding is connected to the control gate of the chopper-inverter switching SCR 17, and whose primary winding is supplied from a gating pulse amplifier and DC supply circuit 32. The gating pulse amplifier 32 in turn is supplied from and controlled by a ramp delay and trigger pulse generator circuit 33 for generating turn-on trigger pulses that are amplified by the gating pulse amplifier 32 and supplied to the control gate of SCR 17 through gating pulse transformer 31. These trigger pulses have a repetition rate (which in one embodiment of the invention can be varied within a predetermined range determined by the setting of a variable timing registor 34 for controlling output power from the circuit) and which determines the operating frequency of the chopper inverter circuit. The ramp delay and trigger pulse generator 33 is supplied by a conductor 91 that is connected to the right of the $L_2$ filter inductor so that the energizing potential supplied to the ramp delay and trigger pulse generator 33 is the same potential that is established across the chopper-inverter SCR/diode pair 17, 18, and is established only after the zero point switching SCR 21 has been rendered conductive to supply enabling potential across the chopper-inverter circuit. The built-in ramp charging delay of circuit 33, and the nature of the gating-on pulses supplied from amplifier 32 to the control gate of SCR 17, then assures the production of a gating-on pulse which is of sufficient magnitude to guarantee turn-on of the SCR 17 under all conceivable operating conditions, and irrespective of loading on the induction heating coil or the magnitude of the supply voltage at any moment.

As described more fully in the above-reference co-pending U.S. application Ser. No. 131,648, the heating coil supplied by the chopper-inverter circuit is in the form of a pancake-shaped, spiral inductive heating coil employed to heat a metal base pan or other cookware physically positioned in inductively coupled relation to the coil. The magnetic lines of flux produced by the pancake-shaped inductive heating coil are tightly coupled to and generate heat within the metal-based pan due to the build-up and collapse of the magnetic lines of flux inductively coupled to the metal-base pan at the relatively high chopping rate or repetition frequency on the order of 20–30 kilocycles per second. More heat is produced per unit current at higher frequencies than at lower frequencies in an inductively heated load such as metal-base cookware due to the higher surface resistivity of the metal at the higher frequency. The pancake-shaped spiral configuration of the induction heating coil provides very close magnetic coupling between the coil and the metal based cookware placed in close proximity to the plane of the coil. However, it has been determined that by proper design of the coil, the radial magnetic field of such coil becomes self-cancelling at relatively short distances away from the coil so that the electro-magnetic radiation levels are kept low to thereby minimize electro-magnetic interference (EMI) and radio frequency interference (RFI) effects. If desired, such inductive heating coils may be connected in series, in parallel, or in series-parallel, to provide power output for multiple loads.

Upon initial start-up of the induction cooking unit shown in FIG. 1, the circuit breaker 13 is closed to supply alternating current and excitation potential to the full wave rectifier 14. The relatively high voltage, full wave rectified, unidirectional potential appearing at the output of rectifier 14 is then supplied across terminals 15 and 16 to the gating pulse amplifier and DC supply 32, the start-up delay inhibit control circuit 23 and zero point switching control circuit 22. However, at initial start-up, the zero point switching SCR 21 will be maintained off due to the delay-inhibit circuit 23 until power is called for. Consequently, no voltage is developed across filter capacitor $C_2$ until such time that zero point switching SCR 21 is made conducting. At this point, if the heating rate control has not been set previously, heating rate control 25 is adjusted to provide a desired heating rate and thereby control the amount of output power produced in each output pulse of the chopper-inverter, and supplied through the inductive heating coil. This heating rate control serves in much the same manner as the flame control adjustment provided on certain gas ranges to allow adjustment of the size of the heating flame, and is in addition to any temperature control such as that shown at 24, that may be provided. If it is used, the desired temperature setting may be made by appropriate adjustment to the pan temperature control 24. Thereafter, the pan temperature control 24 will sense the temperature of the metal base pan or other cookware being heated by the inductive heating coil, and will operate the chopper-inverter in an on-off control manner through start-up delay inhibit circuit 23, zero point switching control 22 and zero point switching SCR 21, to maintain the temperature of the pan at or near the set point determined by the setting of the pan temperature control 24.

Assume that the initial start-up adjustments described above have been made, and that the start-up delay inhibit circuit 23 has enabled the zero point switching control 22 so as to allow it to turn-on the zero point switching SCR 21 at or near the beginning of a half wave of the rectified, unfiltered, high voltage output excitation potential appearing across the supply terminals 15 and 16. Upon zero poinnt switching SCR 21 being turned-on, the inverter circuit commutating capacitor (to be described in connection with FIG. 2) will begin to charge through filter inductor $L_2$, and voltage developed across inductor $L_2$ (initially zero prior to turn-on of SCR 21 as measured from terminal bus 15), will go negative with respect to terminal bus 15 at the point of connection of conductor 91. Thus, it will be appreciated that upon turn-on of the zero point switching SCR 21, the right side terminal bus 16A will go negative with respect to the positive terminal bus 15 thereby enabling the chopper-inverter circuit. The rate of rise of voltage across the chopper-inverter circuit components, and particularly the SCR 17 and diode 18 pair will be determined primarily by the value of the filter capacitor $C_2$, and the dv/dt snubbing network comprising a series connected resistor and capacitor normally connected across the chopper-inverter SCR 17 for limiting this rate of rise of reapplied voltage to some predesigned value consistent with the rating of the SCR.

The development of the voltage across the chopper-inverter in turn enable ramp delay and trigger pulse generator 33 through conductor 91 so as to initiate operation of this circuit, and produce a trigger pulse of precise timing but low voltage amplitude, at some point in time subsequent to turn-on of zero point switching SCR 21, as determined by the setting of the timing resistor 34. This low voltage trigger pulse is then amplified by the gating pulse amplifier 32 and supplied through gating pulse transformer 31 to the control gate of the chopper-inverter switching SCR 17 to cause it to turn-on. Thereafter, the SCR 17 and diode pair 18 automatically will be turned-on and commutated off at a relatively high commutating frequency higher than the overall chopper-inverter operating frequency, and as determined by the value of the commutating components of the circuit in a manner well known in the art. For so long as power is called for by the temperature sensor circuit 24, the chopper-inverter will produce output pulses of power at a level determined by the heating rate control 25 setting and having an operating frequency of the order of 20–30 kilocycles per second as determined by the repetition rate of the trigger pulses generated by the ramp delay of trigger pulse generator 33. This repetition rate in turn is determined by the setting of the adjustable resistor 34 and other parameters of the chopper-inverter circuit as discussed above. Upon reaching the set point temperature, the pan temperature control 24 (if provided) will cause the start-up delay inhibit circuit 23 to inhibit further operation of the zero point switching control 22 so that zero point switching SCR 21 is maintained off until such time that additional heat is called for due to a drop in temperature of the pan or other metal based cookware being inductively heated by the unit.

For a more detailed description of the construction and operation of the chopper-inverter circuit, reference is made to the above-identified copending U.S. application Ser. No. 131,648. Briefly, however, as will be described more fully hereinafter, in connection with FIG. 2B, the chopper-inverter is comprised by the filter inductor $L_2$ which has an inductance $L_2$ which must be properly related to the value of the commutating components. The SCR 17/diode 18 pair comprise a bidirectional conducting gate control semiconductor thyristor switching device that is connected in series circuit relationship with the filter inductor across power supply terminals 15, 16A and hence filter capacitor $C_2$ with the filter inductor $L_2$ being interposed between SCR 17 and diode 18 and the source of direct current excitation potential comprised by capacitor $C_2$. A commutating inductor having inductance $L_1$ and a commutating capacitor having a capacitance $C_1$ is connected in series circuit relationship across the SCR 17/diode 18 pair, and are turned to series resonance at a desired commutating frequency that provides a combined thyristor conduction and commutating period $t_1$ during each cycle of operation of the chopper-inverter. Output power is derived from at least one of the commutating components in a manner to be described hereinafter.

The gating circuit coupled to the control gate of the SCR 17 renders SCR 17 conductive at a controlled frequency of operation that provides an operating period T for the chopper-inverter circuit including a quiescent charging period $t_2$ in each cycle of operation where $T = t_1 + t_2$ such that the value $w_2 t_2$ equals substantially $\pi/2$ radians or greater at the operating frequency and where $w_2$ equals $1^2\sqrt{L_2C_1}$. By designing the chopper-inverter in this manner, the reapplied forward voltage appearing across the SCR/17 diode pair following each conduction interval will be maintained substantially independent of load and the storage of adequate commutating energy prior to each conduction interval of the SCR-diode pair, will be assured. A preferred embodiment of the chopper-inverter also includes a smoothing inductor $L_3$ and a smoothing capacitor $C_3$ connected in series circuit relationship across one of the commutating components, either $L_1$ or $C_1$, in a manner such that the combined impedance of the commutating components, the smoothing inductor and the smoothing capacitor is series resonant with the remaining commutating components at a frequency which establishes the commutating period $t_1$. In a preferred arrangement, the smoothing inductor $L_3$ comprises the planar, inductive heating coil and in combination with the smoothing capacitor $C_3$ shapes the output current flowing through the smoothing inductor (and hence inductive heating coil) to substantially a sinusoidal wave shape producing little or no spurious emission at radio frequencies above the operating frequency of the inverter and providing improved power coupling to the load.

It has been determined, that where the pan or other metal based cookware used in conjunction with the inductive heating coil, is fabricated from stainless steel, iron, titanium, or other lossy metal material (by lossy metal material is meant a metal material having low electrical conductivity), then the effect of the pan is to introduce a resistance in series with the coil with only a minimal or slight change in inductance of the inductive heating coil. However, this is not true of high conductivity pans fabricated from materials having high electrical conductivity such as aluminum, copper, alloys thereof, etc. Where such high conductivity pans or cookware are placed over the inductive heating coil, they result in greatly reducing the effective inductive reactance of the coil. The value of inductance of the inductive heating coil is reduced due to a reduction in the new flux produced by the current flowing through the coil so that in effect, the high conductivity pan or other utensil acts as a short circuited secondary coil of a transformer having a primary coil with an inductance equal to that normally of the inductive heating coil in an unloaded condition. Measurements have shown that where utensils fabricated from a para- or ferromagnetic material (lossy material) are used, perhaps a one percent reduction in load coil inductance occurs. In contrast where high conductivity pans are employed having a magnetic permeability of unity, they very markedly reduce the inductance of inductor $L_3$ and reduce the effective capacitance present at the terminals of capacitor $C_1$ with the result that the commutation period $t_1$ is reduced. A similar reduction in $t_1$ is caused by such a high conductivity load placed near inductor $L_1$.

In the chopper-inverter circuit which excites the inductive heating coil, the trigger pulse supplied to the SCR 17 is developed after a fixed period $t_2$ by a $t_2$ trigger pulse generator 33, and is initiated immediately following the $t_1$ commutation time. As set forth above the period T of the chopper-inverter circuit where $T = t_1 + t_2$ varies directly as $t_1$. Hence, a decrease inn the $t_1$ commutation time caused by the use of a high conductivity load results in a reduction of the operating period T of the chopper-inverter and an increase in operating frequency.

For any given SCR device there is a set of concurrent ratings at a given device temperature which determines the minimum time of the commutation period $t_1$ below which the SCR will fail to turn-off. If the load (in the form of a high conductivity pan) reduces the commutation period $t_1$ below this minimum turn-off time, the SCR will remain on and the input current to the chopper-inverter will rise to a very high value at the peak of the line voltage, and is limited in magnitude only by the series choke coil $L_2$. In such event, the best that can happen is that the main circuit breaker 13 will trip and disconnect the chopper-inverter from the AC input supply line. However, the allowable turn-off time of a given SCR device is least when the supply voltage is greatest, and commutation failure most often times occurs at the peak of the input alternating current supply wave rather than near a zero point. Consequently, large transients of current can be developed as the stored energy in the inductive circuits is dissipated, and it is possible to destroy the SCR in the process.

The chopper-inverter can be protected from commutation failure of the SCR under conditions where the high conductivity pan of aluminum or copper is used in connection with the inductive cooking unit by means of a pan safety control circuit 30 shown in FIG. 1. The pan safety control circuit 30 will be described more fully hereinafter in connection with FIG. 2 of the drawings. Briefly, however, it should be noted that rather than measure or sense the actual reactance and resistance of the chopper-inverter circuit, and the changes produced in these parameters by reason of the use of a high conductivity pan or other cookware, the pan safety control 30 monitors the relative $t_1$ commutation time and the $t_2$ charging time of the chopper-inverter which inherently are governed by the load impedance reflected into the chopper-inverter circuit by the nature of the pan or other cookware placed over the inductive heating coil. The pan safety control 30 protects the chopper-inverter circuit from commutation failure when an aluminum, copper or other high conductivity pan is placed over the inductive heating coil, by monitoring the $t_1$ commutation time of the commutating circuit, and turning off the trigger pulses to the chopper SCR 17 when this $t_1$ commutation time reaches a pre-set minimum value. The circuit provides effective protection for both the mode of operation where the charging period $t_2$ is constant, and the case where the charging period $t_2$ is varied. In either instance, the use of high conductivity pans or other cookware with the inductive cooking unit chopper-inverter, will produce changes in either the ratio $(t_1)/t_2$ ) or the difference $(t_1 - t_2)$ of the respective $t_1$ and $t_2$ operating times.

FIG. 2 is a detailed, schematic circuit diagram of a new and improved induction cooking unit power supply system including a pan safety control 30 constructed in accordance with the invention, and illustrated in functional block diagram form in FIG. 1. From FIG. 2, it will be seen that the negative potential appearing at terminal 16A on the inverter end of filter inductor $L_2$, is fed through conductor 91 and voltage dropping resistor 93 across a zener diode 92. The stabilized voltage appearing across zener diode 92 is applied across a charging capacitor 94 through the variable timing resistor 34. This voltage is applied to a silicon unilateral switch (SUS) or a programmable unijunction transistor (PUT) 95 which is a threshold device that breaks down and conducts upon the voltage across the device reaching a fixed threshold voltage value. Upon this threshold voltage value being obtained by capacitor 94, a trigger pulse is produced across a small load resistor connected in series with the SUS 95 that is coupled through an RC network to the base of a PNP gating transistor 97. The time interval required for the voltage across zener diode 92 to charge capacitor 94 to the threshold breakover value of SUS 95 is the quiescent $t_2$ charging time of the chopper-inverter circuit.

The discharge of capacitor 94 through SUS 95 and RC network 96, produces a sharp, negative-going pulse of voltage on the base of a PNP power amplifer transistor 97 which turns the transistor on for the duration of the pulse, and produces a much larger, amplified gating-on pulse across the primary winding 98 of a pulse transformer $T_1$. This gating-on pulse is transformed to the secondary winding 99 of the pulse transformer $T_1$ and causes the large power rated chopper SCR 17 to be gated on at a repetition rate determined by the repetition rate of the trigger pulses generated by SUS 95. The circuit is completed by a large value discharge resistor 108 that is connected across the filter capacitor $C_2$ and assures rapid and complete discharge of capacitors $C_1$, $C_2$, $C_3$, etc., upon the zero point switching SCR 21 being turned-off. It is important that these capacitors be discharged to obtain conduction of the zero point switching SCR 21 as near to the zero point of the supply alternating current as possible upon a turn-on gating signal being applied to zero point switching SCR 21. It is also desirable that a conventional dv/dt snubber circuit comprised by a series connected resistor 109 and capacitor 111 be connected across the large power rated chopper SCR 17 and feedback diode 18 for limiting the rate of reapplied forward voltage across the SCR 17 following turn-off of the feedback diode 18 during each commutation interval in a manner well known to those skilled in the art.

For convenience, the filter capacitor $C_3$ is comprised by two smaller capacitors $C_{3a}$ and $C_{3b}$ connected in series circuit relationship with the inductive heating coil $L_3$ with thhe series circuit thus comprised being connected across the $C_1$ commutating capacitor $C_{1a} - C_{5a}$, in the manner shown in FIG. 2. Energizing potential for supplying appropriate biasing to the power gating transistor 97 is obtained by a diode rectifier 101 and voltage dropping resistor 103 connected in series circuit relationship with a zener diode 105 across the high voltage direct current power supply terminals 15 and 16. The pulse transformer $T_1$ also has a third or auxiliary winding 106 that is connected in series circuit relationship with a pulse sustaining network comprised by a capacitor 107 and current limiting resistor and that is connected to the base of PNP gating transistor 97 for prolonging its conduction over a predetermined pulse duration period to assure adequate gating power being supplied through the pulse transformer $T_1$ to gate on the power chopper SCR 17. Alternatively, a low voltage, gate signal developing pilot SCR could be employed in place of the third auxiliary winding connection for the same purpose. A convenient and useful device for indicating when the chopper-inverter circuit is operating, is provided by a neon lamp 100 connected in series with a dropping resistor across the choke inductor $L_2$. The neon lamp 100 turns-on only while the high frequency potential is developed across the inductor $L_2$, and since the DC resistance of conductor $L_2$ is very low, the lamp does not respond to the DC current passing through the conductor. The brightness of the lamp 100 will remain uniform because the high frequency component of the current $I_L$ flowing through the choke inductor $L_2$ does not change greatly for changes in loading ranging from no load to full load conditions.

The important characteristic to note in connection with the above-described $t_2$ timer gating circuit, is that the gating pulse energy supplied to the control gate of the power chopper SCR 17 is derived from the DC storage capacitor 102 connected across zener diode 105, which in turn is charged directly from across the high voltage power supply terminals 15 and 16. The start-up delay inhibit circuit 23 assures that the capacitor 102 comes fully charged before zero point switching SCR 21 is turned-on, and the supply voltage to the chopper-inverter appears across filter capacitor $C_2$. As a result, pulses of ample and equal magnitude are provided at the gate of chopper SCR 17 at all times including those portions of the supply, full wave rectified potential near the zero point (identified as the valley of the ripple). Hence, the gating circuit arrangement provides gating pulses of sufficient strength and of minimum charging delay $t_2$ to assure turn-on of the chopper SCR 17, and to assure an inverter chopping rate which remains essentially constant and independent of the value of the rectifier full wave potential appearing between power supply terminals 15 and 16. In this circuit, the SUS 95 provides pulses of equal magnitude and with constant delay down to a voltage as low as 12 volts across the power supply terminals 15 and 16. It is a function of the filter capacitor $C_2$ to prevent the value of the supply voltage from falling below 12 volts in the valley of the ripple, even under conditions of greatest chopper-inverter loading. By reason of the independent power supply comprised by diode rectifier 101, dividing resistor 103, zener diode 105 and capacitor 102, the gating pulse amplifier 97 will assure provision of gating pulse of sufficient amplitude or strength to gate-on the high power chopper SCR 17 due to the built-in delay inherent in the operation of the zero point switching SCR 21.

FIG. 3(*a*) of the drawings illustrates the wave form of the load current flowing through conductor $L_1$ of the chopper-inverter circuit over two cycles of operation. The positive sinusoid represents the interval of conduction of the SCR 17 and the negative sinusoid the interval of conduction of the feedback diode while the $t_2$ charging time is indicated as a ramp voltage gradually increasing from some negative value towards zero just prior to the commencement of a new $t_1$ commutation interval represented by the combined conduction periods of the SCR 17 and feedback diode 18 pair.

FIG. 3(*b*) illustrates the asymmetric square wave voltage appearing across the zener diode 92 which supplies the $t_2$ timer SUS 95 and charging capacitor 94 of trigger pulse generator 33. From a consideration of FIG. 3(*b*), it will be appreciated that the voltage across zener diode 92 is zero referred to the positive side 15 of the full wave rectified potential appearing across power supply terminals 15 and 16. The intervals of conduction S and D of the SCR 17 and feedback diode 18, respectively, also are shown. During the $t_2$ off charging period, the voltage across zener diode 92 is negative and at the regulating level (minus 12 volts) of the zener diode. From a further consideration of the voltage wave form shown in FIG. 3(*b*), it will be seen that the direction of a voltage change at time $t = 0$ and at time $t = t_1$ are positive-going and negative-going, respectively, where $t = t_0$ is the point of turn-on of SCR 17 and $t = t_1$ corresponds to the point of turn-off of the feedback diode 18 (and hence the termination of the commutation period). Accordingly, if the wave form shown in FIG. 3(*b*) is differentiated and rectified appropriately, a positive $t = 0$ pulse and a negative $t = t_1$ pulse can be derived at separate terminals with respect to the positive main terminal bus 15, and would appear in time and wave shape as shown in FIG. 3(*c*) of the drawings.

Under conditions where a pan of suitable ferromagnetic material such as stainless steel, iron, etc., is employed in conjunction with the inductive heating coil, the $t_1$ period remains essentially unchanged, and the $t = t_1$ timing pulse shown in FIG. 3(*c*) will occur within some preset or predictable range of values. Suppose now that the $t = t_0$ pulse shown in FIG. 3(*c*) is used in a pan safety circuit to develop a timing pedestal gating signal pulse of voltage of fixed amplitude and stable time duration $t = t_{1'} - t_{1''}$ as shown in FIGS. 3(*e*), 3(*j*) and 3(*n*) of the drawings. By appropriately delaying the generation of this timing pedestal gating signal pulse $t_{1'} - t_{1''}$ so that it occurs only during the preset or predictable period when the $t_1$ timing signal pulse would occur under conditions where a pan or proper ferromagnetic material is being used with the inductive heating coil, it will be seen that the timing pedestal gating signal pulse in effect then can be used to define a preset safe limit on the conduction interval of the chopper SCR/diode pair. If then, an aluminum, copper or other highly conductive pan load is employed with the induction cooking coil, the $t = t_1$ timing signal pulse will occur early, depending on the area of the surface of the utensil and its distance from the inductive heating coil as well as its electrical conductance at the operating frequency, assuming that the circuit is on and running and the pan is brought into proximity with the inductive heating coil (hereinafter referred to a Case I condition). Under Case I condition, the $t = t_1$ timing signal pulse will occur in advance of the timing pedestal gating signal pulse $t_1' - t_1''$ as shown in FIGS. 3(*j*) – 3(*k*) of the drawings. Under such circumstances, it will be seen that anticoincidence occurs, and that the application of the two signals to a coincidence circuit would result in the production of an anticoincidence output signal pulse shown in FIG. 3(*k*) for application to a safety means controlling operation of the chopper-inverter. Conversely, under operating conditions (hereinafter referred to as Case II condition) where the aluminum, copper or other highly conductive pan load first is disposed over the inductive heating coil prior to initially placing the circuit in operation, the $t = t_1$ timing signal pulse will occur late with respect to the timing pedestal gating signal pulse $t_1' - t_1''$ as shown in the FIGS. 3(*m*) – 3(*o*) of the drawings. Here again it will be appreciated that an anticoincidence situation will occur resulting in the production of an anticoincidence output signal that can be used to operate an alarm or safety means for shutting down operation of the chopper-inverter circuit.

The pan safety control circuit shown at 30 in FIG. 1, and in greater detail in FIG. 2 of the drawings, is designed to provide the above-described control features and is comprised by (1) sampling means responsive to conduction through the chopper-inverter SCR/diode pair for deriving the $t_o$ and $t_1$ timing signal pulses indicative of the conduction intervals of the SCR/diode pair, (2) conduction interval limit setting means responsive to the $t_0$ timing signal pulse for defining safe limits to the respective conduction intervals for the chopper-inverter SCR/diode pair (3) comparison means in the form of a coincidence circuit responsive to (1) and (2) for comparing the actual conduction intervals of the chopper-inverter SCR/diode pair to the preset safe limits, and (4) safety means responsive to the output from (3) for controlling operation of the chopper-inverter in response to an alarm output signal from (3).

Figure 2A:
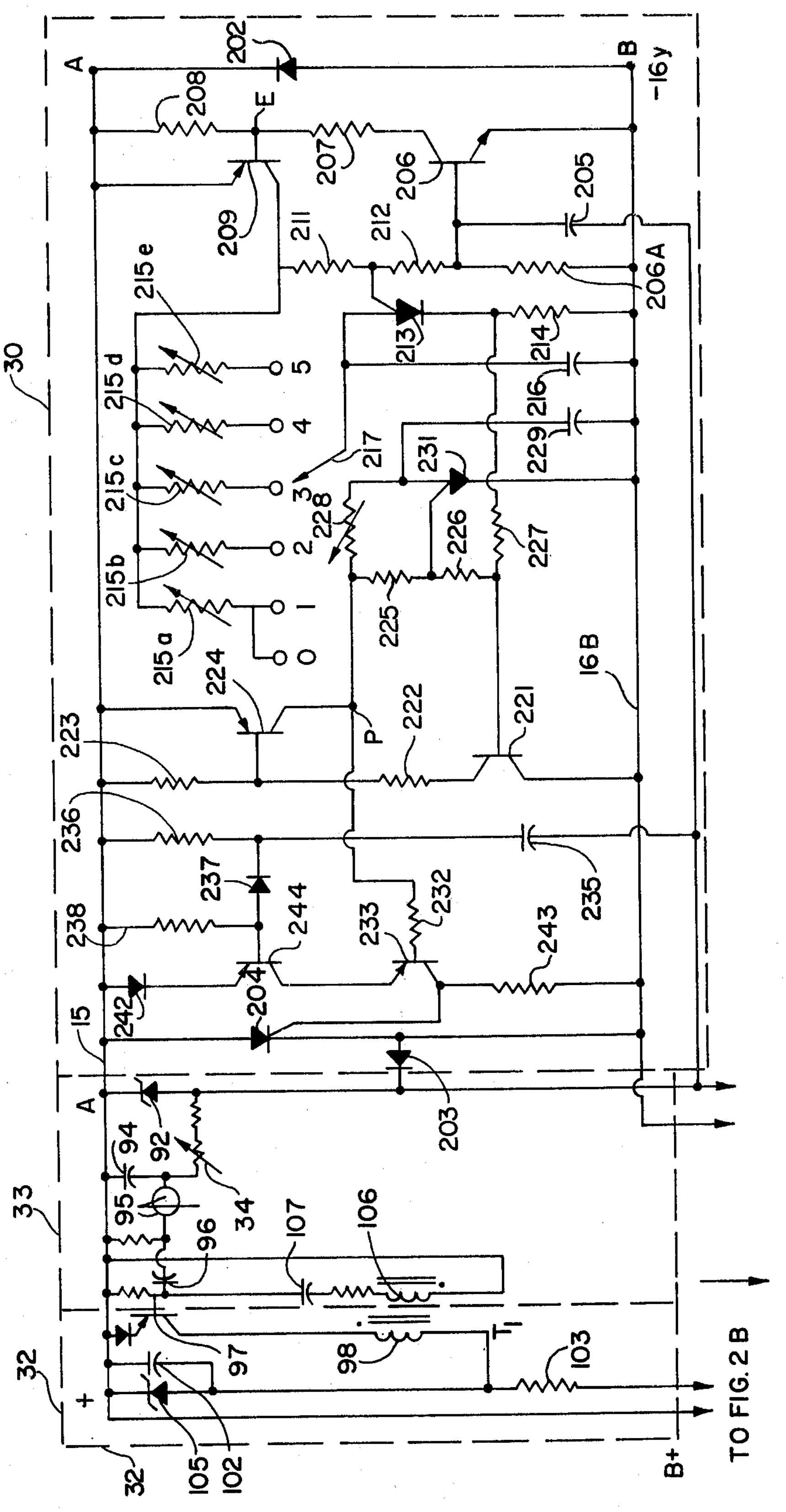
FIGS. 2A and 2B comprise a detailed schematic circuit diagram of a lower power model (115v.) of the new and improved induction heating cooking apparatus shown functionally in FIG. 1.
Figure 2B:
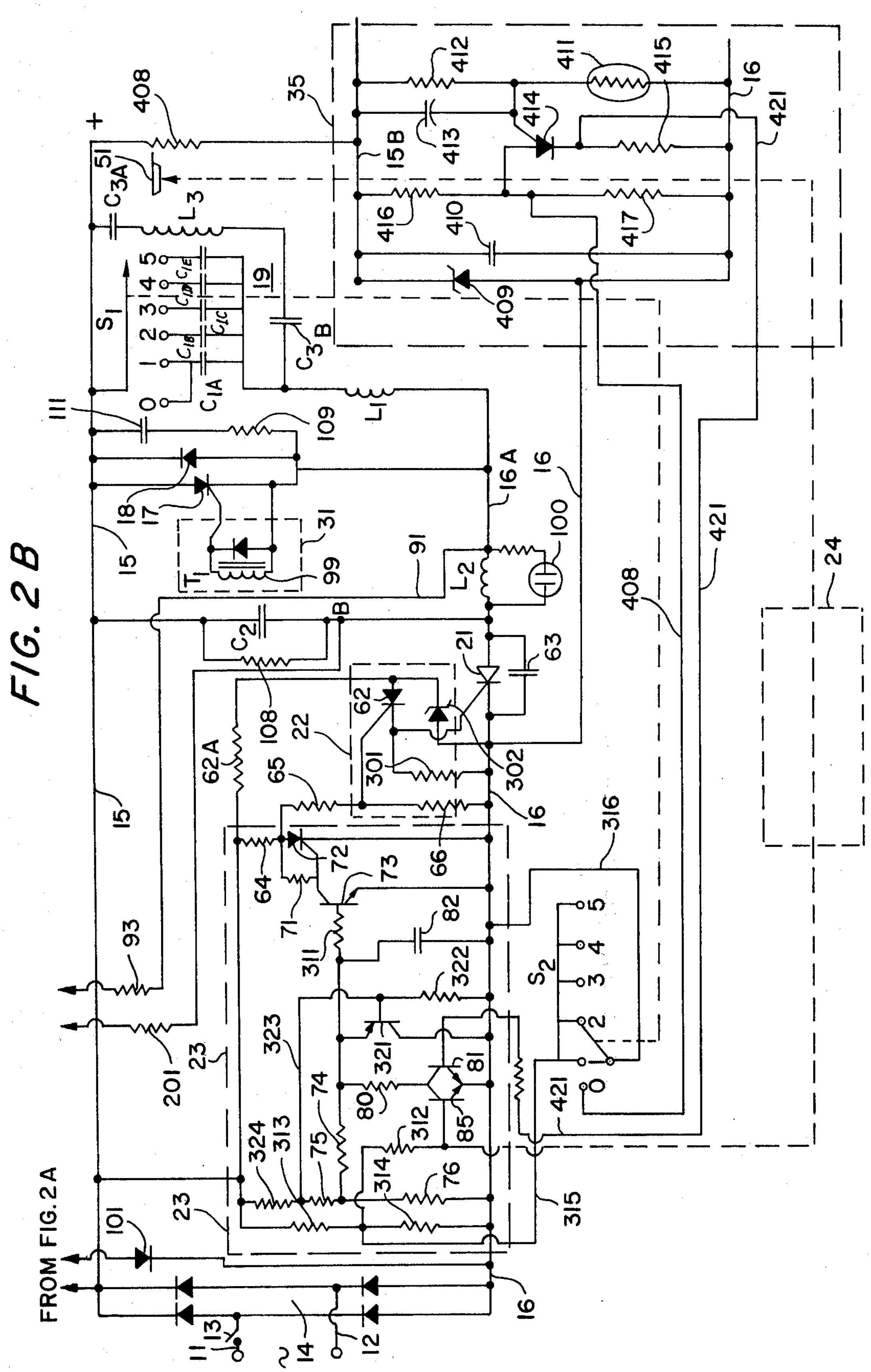

As best shown in FIG. 2A the pan safety control circuit 30 is supplied with direct current excitation voltage through a voltage dividing resistor 201 from a source between points A and C connected across filter capacitor $C_2$. A zener diode 202 clamps the pan safety supply voltage to a constant level of about −16 volts. This level of supply voltage for the pan safety control (hereinafter referred to PSC), is arranged to be a few volts more than the regulating level of about 12 volts of the zener diode 92 used in the $t_2$ timer trigger pulse signal generating circuit 33. An isolating diode 203 is connected so as being reverse biased between the negative terminals of the two zener diodes 202 and 92. Diode 203 also is connected to the cathode of a latching SCR 204 having its load terminals connected between the power supply terminals 15 and 16(B), and operating through the isolating diode 203 to shunt zener diode 92. By this arrangement, if the latching SCR 204 is caused to conduct, it will latch into conduction and short circuit both the zener diode 202 and the $t_2$ - timer zener diode 92 via the inter-connecting isolating diode 203. As a consequence, trigger pulses for supply to the gating electrode of the chopper SCR 17 can no longer be generated by the $t_2$ trigger circuit 33, and the chopper-inverter will cease to operate. The latching SCR 204 will remain latched in its conducting condition despite turn-off of the chopper-inverter since the DC supplied to the filter capacitor $C_2$ remains on. To restart the chopper-inverter, the direct current voltage to the filter capacitor $C_2$ must be removed. This is easily done with the zero point switching SCR 21 as will be described hereinafter. Thus, it will be appreciated that the latching SCR 204 serves as a safety means for turning off the chopper-inverter upon being rendered conductive by an output alarm signal from the pan safety control circuit 30 in a manner to be described more fully hereinafter. However, during normal operation of the inductive cooking unit, the $t_2$ - timer trigger circuit 33 is free to operate independently of the pan safety control to produce trigger pulses for the main chopper SCR 17 because of the isolation provided by isolating diode 203.

The sampling mens for the pan safety control 30 is comprised in part by a first coupling capacitor 205 which in conjunction with a resistor 206A and first transistor 206 operates to differentiate the positive going potential appearing across points A-D at the start of the $t_1$ conduction interval of the SCR/diode pair to thereby produce a first $t_0$ timing signal pulse representative of the start of conduction of the main chopper SCR/diode pair. This first $t_0$ timing signal pulse is applied to the base of a first NPN junction transistor 206 connected in series circuit relationship with a first set of voltage dividing resistors 207 and 208 across terminals 15–16B of the low voltage pan safety control circuit power source 202. A first feedback PNP junction transistor 209 has its base connected to the junction of voltage dividing resistors 207 and 208 and has its emitter-collector connected in series circuit relationship with a second set of voltage dividing resistors comprised by the resistors 211, 212 and 206. A first programmable unijunction transistor 213 (hereinafter referred to as PUT 213) has its anode gate connected to an intermediate point on the second set of voltage dividing resistors 211, 212 and 206 and has its cathode connected through a load resistor 214 to the negative terminal 16(B) of the low voltage pan safety circuit power supply. A series connected set of first variable resistors 215, 215(*a*) through 215(*e*) are connected in series circuit relationship with a timing capacitor 216 with the series circuit thus comprised being connected in parallel circuit relationship with the second set of voltage dividing resistors 211, 212 and 206. The anode of PUT 213 is connected to the junction of capacitor 216 with the first set of variable resistors 215(*a*) through 215(*e*). The first set of variable resistors 215(*a*) through 215(*e*) preferably comprises a plurality of independently adjustable resistors which may selectively be connected in and out of series circuit relationship with the timing capacitor 216 through the medium of a delay period setting switch 217 that comprises a means for setting the delay period of a delayed pedestal timing signal pulse produced by the monostable multivibrator circuit comprised in part by the PUT 2B. If desired, this switch may be ganged for selective operation in conjunction with the power level selector switch $S_1$ and $S_2$ of the chopperinverter as would be obvious to one skilled in the art. Alternatively, resistor 215 could be preset to provide a pedestal timing signal pulse of adequate pulse duration for all levels of power. The PUT (programmable unijunction transistor) is a three terminal, planar passivated PNPN semiconductor switching device manufactured and sold by the General Electric Company. For a detailed description of the PUT, reference is made to application note 60.20 issued November 1967, by the General Electric Company-Semiconductor Products Department with respect to the D13T1 and D13T2 programmable unijunction transistor devices.

Briefly, the operation of the PUT 213 is as follows: Upon the voltage across timing capacitor 216 being built up to a value exceeding that of the reference value established by the voltage dividing resistors 211, 212 and 206, PUT 213 becomes forward biased and breaks down and conducts. This threshold conduction point can be varied by adjustment of the selector switch 217 to connect in different ones of the variable value resistors 215($a$) – 215($e$). Upon PUT 213 being rendered conductive, a positive going voltage is produced across the load resistor 214 which is supplied to the base of a second NPN junction transistor 221 that has its emitter-collector connected in series circuit relationship with a third set of voltage dividing resistors 222 and 232. A second PNP feedback transistor 224 has its base connected to the junction of resistors 222 and 223 and has its emitter-collector connected in series circuit relationship with a fourth set of voltage dividing resistors 225 and 226 which in turn are connected in series with a current limiting resistor 227 and the load resistor 214 for PUT 213 with the junction of resistors 226 and 227 being connected to the base of the second NPN junction transistor 221. A second variable resistor 228 is connected in series circuit relationship with a second timing capacitor 229 between the collector of the second PNP feedback transistor 224 and the negative 16(B) of the low voltage direct current pan safety control power source comprised by Zener diode 202. The junction of variable resistor 228 and timing capacitor 229 is connected to the anode of a second PUT 231 whose anode gate is connected to the juncture of the fourth set of voltage dividing resistors 225 and 226 and whose cathode is connected directly to the negative terminal 16(B).

In operation, the monostable multivibrator circuit comprised by the above-described elements functions in the following manner. The positive going voltage pulse supplied across conductor 91 and appearing at point D is differentiated by capacitor 205 and resistor 206 and applied to the base of the first NPN junction transistor 206 causing transistor 206 to turn-on. Turn-on transistor 206 results in driving the base of the first PNP feedback transistor 209 negatively toward the potential of negative terminal 16(B) and causes transistor 209 to turn-on. Transistors 209 and 206 regeneratively interconnected so that turn-on of 209 serves to maintain 206 in its conducting condition. Turn-on of transistor 209 also starts charging the timing capacitor 216 toward the potential of the collector of the PNP transistor 209 through a selected one of the variable resistors 215($a$) through 215($e$). After some preset delay period determined by the setting of selector switch 217, PUT 213 turns-on and produces a positive going voltage that is supplied through limiting resistor 227 to the base of the second NPN junction transistor 221. Turn on of PUT 213 also operates to remove the feedback to the base of transistor 206 so that it is allowed to turn-off. This in turn results in turning off the first PNP feedback transistor 209 and results in removing the positive voltage for the anode gate of PUT 213 thereby allowing PUT 213 to turn-off after timing capacitor 216 has become sufficiently discharged through load resistor 214. The delay period established prior to conduction of PUT 213 is depicted by the wave form of the voltage at point E applied to the base of PNP transistor 209 and is illustrated in FIG. 3($d$) of the drawings.

The positive going, delayed trigger pulse developed across load resistor 214 upon PUT 213 being rendered conductive, causes the second NPN junction transistor 221 to turn-on and results in turning on the second feedback PNP transistor 224. Transistors 221 and 224 are connected regeneratively through the second set of voltage dividing resistors 225 and 226 so that upon transistor 224 turning-on, a feedback potential is applied to the base of transistor 221 to hold this transistor turned-on. Turn-on of the PNP transistor 224 will cause the second timing capacitor 229 to start charging towards the potential of the collector of the PNP transistor 224 and after a preset period determined by the setting of the second variable resistor 228, will cause the second PUT 231 to break down and conduct. Conduction of the second PUT 231 results in removing feedback potential to the base of transistor 221 and causes this transistor together with the second PNP transistor 224 to turn-off. As a consequence of this operation, the voltage at point P on the emitter of the second feedback PNP transistor 224 will appear as shown in FIG. 3($e$) of the drawings and will have a duration $t_1' - t_1''$ which is determined by the setting of the second variable resistor 228, and constitutes the desired delayed pedestal limit setting signal pulse that is supplied through a current limiting resistor 232 to the base of the PNP junction transistor 233 comprising a part of the comparison circuit means of the PSC.

Referring again to FIGS. 3($b$) and 3($c$) of the drawings, it will be seen that at the end of the $t_1$ commutation interval when conduction through the SCR/diode pair terminates, the voltage at point D drops sharply to the −12 volt regulating level of zener diode 92 as shown in FIG. 3($b$) of the drawings. This drop in voltage is sampled by the sampling circuit means comprised by a second differentiating circuit including capacitor 235 and resistor 236. The differentiated, negative going, second timing signal pulse produced by differentiating network 235 and 236 is coupled across an isolating diode 237 and resistor 238 to the base of a PNP junction transistor 241 also comprising a part of the comparison circuit means of the PSC.

The comparison circuit means of pan safety control circuit 30 is comprised by a coincidence circuit formed by the two PNP junction transistors 241 and 233 which are connected in series so that the collector of transistor 241 connects to the emitter of transistor 233. This pair of transistors is then connected in series circuit relationship with a diode 242 and load resistor 243 across the low voltage pan safety direct current power supply terminals 15 and 16B. The load resistor 243 in turn is directly connected to the control gate of the latching safety SCR 204. With this circuit arrangement, by appropriate adjustment of the first variable resistor comprised by selector switch 217 and the adjustable resistors 215(*a*) – 215(*e*), and by further adjustment of resistor 228 to the width of the pedestal limit setting pulse appearing at point P and supplied to the base of the PNP transistor 233 in the coincidence circuit, it will be seen from FIGS. 3(*e*) and 3(*f*) of the drawings that the limit setting pedestal pulse applied to resistor 233 can be made to be coincident with $t_1$ timing pulse applied to the base of coincidence transistor 241 during normal operation of the chopper-inverter where a proper ferromagnetic pan load is imposed on the conductive heating coil being excited by the chopper-inverter. Since the pedestal limit setting signal pulse has a positive polarity as shown in FIG. 3(*e*), coincidence transistor 233 will be maintained off at the point in time when the negative going $t_1$ timing pulse is applied to the base of the coincidence transistor 241. Hence, no output will appear across the load resistor 243 as shown in FIG. 3(*g*) of the drawings and as a consequence the latching safety SCR 204 will be maintained in its off condition thereby allowing trigger pulses to be generated by the SUS 95 in the normal manner described above.

In contrast to the above-described normal operating condition, if now an aluminum, copper or other nonferrous, highly conductive pan load is placed over the inductive heating coil, the $t = t_1$ timing signal pulse will occur at a much earlier point in time as indicated by FIGS. 3(*h*) and 3(*i*) of the drawings. This is due to the markedly shortened commutation interval $t_1$ caused by the detuning effects of the highly conductive pan as explained earlier. Consequently, from a comparison of FIGS. 3(*i*) to 3(*j*) it will be seen that the $t_1$ timing pulse indicative of the termination of conduction of the chopper-inverter SCR/diode pair, occurs at a point in time ahead of the limit setting pedestal timing pulse $t_{1'} - t_{1''}$ shown in FIG. 3(*j*). In the pan safety circuit, the base of PNP transistor 233 of the coincidence circuit normally is maintained at a negative potential relative to its emitter. Hence, PNP transistor 233 will be in normally conducting condition at the point in time when the $t_1$ timing signal pulse is produced at the end of the conduction interval of the chopper-inverter SCR/diode pair, at which point transistor 241 in the coincidence circuit is rendered conductive. With both transistors 241 and 233 conductive, a positive going signal pulse similar to that illustrated in FIG. 3(*k*) of the drawings will be produced and applied to the gate of the latching safety SCR 204 causing it to turn-on.

Upon SCR 204 being turned-on, isolating diode 203 becomes forward biased and operates through the conducting SCR 204 to shunt the zener diode 92 thereby terminating further supply of excitation potential to the SUS 95 in trigger generator circuit 33. The latching SCR 204 will remain conductive and hence inhibit further operation of the trigger generator circuit 33 for so long as direct current power remains on the circuit. Accordingly, in order to place (reset) the circuit back in operation, it is necessary for the operator to return the power level control back to zero or at least from one power level setting to another so as to turn-off the zero point switching SCR 21 momentarily. This exercise has been built into the circuit in order to educate the operator that he will need to remove the highly conductive pan from the conductive heating coil before the circuit can be rendered operative in a normal and safe manner.

The above-described operation is true for Case I where the chopper-inverter is operating in a normal manner under no load conditions, and thereafter a highly conductive aluminum or copper pan is placed over the inductive heating coil. However, for Case II where the conductive pan is placed over the inductive heating coil in advance of placing the inverter circuit in operation, different conditions prevail. Under these last stated conditions of Case II, it has been determined that due to the detuning effect of the highly conductive pan on the inductive heating coil, the normal conduction interval of the chopper-inverter SCR/diode pair is greatly extended in the manner predicted in FIG. 3(l) of the drawings due to the fact that the highly conductive pan causes a surge current to be oscillated back and forth between the $C_3$, $L_3$ and $C_1$, $L_1$ components prior to being returned or reflected back across the SCR/diode pair with sufficient energy to reverse bias the SCR/diode pair and cause turn-off of these devices. Under these operating conditions, the $t_1$ timing signal pulse will be produced at a point in time after t the $t_1 - t_1$ limit setting pedestal signal pulse as shown in FIG. 3(*m*) and 3(*n*) of the drawings. Here again, transistor 233 in the coincidence circuit will be in its normally conducting condition at the point in time when the $t_1$ timing signal pulse occurs so that an output gating signal is produced across the load resistor 243 and applied to the latching safety SCR 204 in the manner described above. Thus, it will be appreciated that it does not matter whether the circuit is being operated under either Case I or Case II conditions, the pan safety control circuit 30 is operative to turn-off and inhibit production of trigger signal pulse and the trigger signal generator 33.

In addition to the pan safety control 30, the new and improved induction cooking power supply system shown in FIG. 2 also includes an improved zero point switching control circuit 22 and an improved start-up and delay inhibit circuit 23 for controlling operation of the zero point switching SCR 21. As shown in FIG. 2, the zero point switching SCR 21 has its gate electrode connected to the juncture of a gating resistor 301 connected in series circuit relationship with a low voltage, pilot turn-on SCR 62 and a voltage dividing resistor 62A with the series circuit thus comprised being connected across the power supply terminals 15 and 16 to the left of the zero point switching SCR 21. Consequently, the direct current potential is maintained across this pilot switching SCR 62 and resistor 301 being across the switching SCR 62 and gating resistor 301 being stabilized by a zener diode 302 connected across these two elements. With this arrangement, upon a positive polarity gating potential being applied to the control gate of the low voltage pilot switching SCR 62, SCR 62 turns-on and applies a positive polarity gating current to the control gate of the zero point switching SCR 21 to cause this larger, power rated SCR to turn-on.

The gating electrode of the switching SCR 62 is connected to the juncture of a set of voltage dividing resistors 64, 65 and 66 which in turn are connected in series circuit relationship across the power supply terminals 15 and 16 to the left or rectifier side of the zero point switching SCR 21. In the absence of any further control, a positive polarity gating-on potential will be applied from resistor 65 and 66 to the gate of the low voltage pilot switching SCR 62 during each half cycle of the full wave rectified potential appearing across terminals 15 and 16 with SCR 21 in its nonconducting, current blocking condition. Note that with SCR 21 in its current blocking condition, the bleeder resistor 108 around filter capacitor $C_2$ will have bled off any charge on this capacitor so that the potential appearing across power supply terminal buses 15 and 16 is in effect the potential appearing at the output of a full wave rectifier 14. However, the voltage dividing resistors 65 and 66 have a low voltage, latching inhibit SCR 72 connected in parallel therewith between the junction of resistors 64 and 65 and the negative terminal bus 16. A bleeding resistor 71 is connected between the juncture of voltage dividing resistors 64 and 65 and the control gate of the latching SCR 72. The delays and threshold potentials designed into the circuit are such that the latching inhibit SCR 72 will be gated-on normally in advance of turn-on of the SCR 62. Hence, turn-on of the latching SCR 72 will inhibit thereafter through the remaining half cycle of the supply alternating current wave any turn-on of the low voltage pilot switching SCR 62 and hence, the zero point switching SCR 21. The inhibiting action will be reproduced for each sinusoidal half cycle of the full wave rectified potential appearing across the power supply terminal buses 15 and 16.

In order to prevent turn-on of the inhibit latching SCR 72 (and thereby allow the low voltage pilot switching SCR 62 to turn-on with consequent turn-on of the zero point switching SCR 21), an NPN junction turn-on control transistor 73 is provided with its collector connected to the control gate of the inhibiting SCR 72 and its emitter connected directly to the negative terminal bus 16. With this arrangement, upon the control transistor 73 being turned-on, it will clamp the potential of the control gate of the inhibiting SCR 72 to the potential of the negative terminal bus 16 thereby preventing turn-on of the inhibiting SCR 72. With the inhibiting SCR 72 thus maintained off, the low voltage pilot switching SCR 62 will be allowed to turn-on thereby turning-on the zero point switching SCR 21.

To control turn-on and turn-off of the control transistor 73, the start-up delay and inhibit circuit 23 further includes a delay timing capacitor 82 that is connected through a limiting resistor 311 to the base of control transistor 73 and is connected through a limiting resistor 74 to the juncture of a set of voltage dividing resistors 75, 76 and 324. With this arrangement, the delay timing capacitor 82 will be charged from the potential appearing across the voltage dividing resistors 75, 76 and 324 at some predetermined changing rate depending upon the resistance-capacitance time constant of the circuit. Transistor 73 is an NPN transistor and normally is nonconductive until such time that the bias applied to its base by the delay timing capacitor 82 becomes sufficiently positive to turn it on. Thus, there is a built-in delay time required to charge capacitor 82 to a level sufficient to turn-on transistor 73. Upon reaching this point, transistor 73 normally will turn-on. However, should transistor 73 turn-on at some intermediate point in a half cycle of the supply full wave rectified potential, inhibiting SCR 72 will have already turned-on and be latched-in a conducting condition until the end of the half cycle. In the next succeeding half cycle, because of the conducting condition of the transistor 73, SCR 72 will be inhibited from conducting, thereby allowing the low voltage pilot switching SCR 62 and zero point switching SCR 21 to be turned-on at or near a zero point of the supply full wave rectified potential. Thus, soft starting at or near the zero point of the supply full wave rectified potential is assured thereby preventing surge charging of the filter capacitor $C_2$ and the commutating capacitor elements of the chopper-inverter power circuit along with the undesirable consequences that can result from such surge charging.

In order to control the turn-on and turn-off of the control transistor 73 in accordance with the output of some control function such as the pan temperature control 24, for example, a set of parallel connected, NPN junction inhibiting transistors 81 and 85 are provided with their emitters connected together and their collectors connected together, are this parallel combination connected in series circuit relationship through a limiting resistor 80 between the junctures of the resistors 74 and 311 and the negative power supply terminal bus 16. With this arrangement, upon either one or both of the inhibiting transistors 81 or 85 being turned-on, the potential of the base of the control transistor 73 will be lowered towards the potential of the negative power supply terminal bus 16 so as to prevent its turn-on. In this condition, the inhibiting SCR 72 will be latched-on at the commencement of each half cycle of the supply full wave rectified potential thereby inhibiting further gating signal to the low voltage pilot switching SCR 62 and the zero point switching SCR 21 and this will result in turning off the inductive cooking unit power supply. For a more detailed description of the pan temperature control circuit 24, reference is made to the above-identified copending U.S. application Ser. No. 131,648. Briefly, however, it can be stated that the pan temperature control senses whether the temperature of the pan 51 being inductively heated has exceeded a preset desired pan temperature, and produces a positive polarity control signal pulse that is supplied to the base of the inhibiting transistor 85 to cause it to turn-on. Upon transistor 85 being turned-on, it will discharge the delay timing capacitor 82 sufficiently to cause the control transistor 73 to turn-off. This condition will then be maintained for so long as the pan temperature control 24 calls for removal of power. Thereafter, upon the pan 51 temperature dropping below the desired temperature value, the pan temperature control 24 will remove the positive bias applied to the base of the inhibiting transistor 85 thereby causing transistor 85 to turn-off. Upon this occurrence, charge on the delay timing capacitor 82 will again build up to the point that it turns-on the control transistor 73 thereby preventing inhibiting SCR 72 from being turned-on, and allowing the pilot switch SCR 62 and zero point switching SCR 21 to turn-on at or near the zero point of the next succeeding half cycle of the full wave rectified potential appearing across power supply terminal buses 15 and 16.

In addition to the above-described control action, it should be noted that the base of the inhibiting transistor 85 is connected through a limiting resistor 312 back to the juncture of a set of voltage dividing resistors 313 and 314. This juncture is also connected back through a conductor 315 to a set of contact points 1 through 5 of power level selector switch $S_2$ whose movable contact is connected through a conductor 316 back to the negative power supply terminal 16. By this arrangement, whenever the power level selector switch $S_2$ is closed on one of its contacts 1–5 the mid-tap point of the voltage dividing resistor 313 and 314 will be clamped to the potential of the negative power supply terminal 16. However, in between each of the contact points this clamping potential is removed so that as the power level selector switch $S_2$ is moved from one contact point to the next in order to switch in different values of commutating capacitance $C_{1A} - C_{1E}$ through the medium of a progressively shorting switch, a positive turn-on potential will be applied through resistor 312 to the base of inhibiting transistor 85 so as to maintain zero point switching SCR 21 turned-off and in its current blocking condition during the switching action affecting the commutating capacitors $C_{1A} - C_{1E}$ in a manner described more fully in the above-referenced copending U.S. application Ser. No. 131,648. In this manner operation of the chopper-inverter circuit concurrently with the switching of the commutating capacitor elements $C_{1A} - C_{1E}$ is avoided thereby avoiding dangerous arcing or sparking which otherwise might occur if such switching took place while the chopper-inverter was in operation.

In order to assure fast response to the turn-off and then rapid turn-on of the power line switch or circuit breaker 13, a discharge transistor 321 is incorporated which has its emitter-collector connected in parallel circuit relationship across the delay timing capacitor 82. The base of the discharge transistor 321 is connected through a resistor 322 to the negative power supply terminal 16 and through a conductor 323 to the juncture of voltage dividing resistors 324 and 75. The discharge transistor 321 is a PNP junction transistor so that upon initial turn-off of input power through breaker 13 the transistor 321 is biased into conduction and quickly discharges any residual potential on capacitor 82. When the main power is turn-on via breaker 13, the discharge transistor 321 is prevented from conducting by biasing its base of a potential above that which appears across the resistor 76 by an amount determined by voltage dividers 75, 76 and 324 and supplied across conductor 323. Thus, discharge transistor 321 upon turn-on of the circuit, conducts for a negligible length of time and charge builds up on delay capacitor 82 and the circuit operates to control turn-on of the control transistor 73 as described previously.

A second on-off control over the operation of the inductive cooking unit power supply is provided through the medium of the inhibiting transistor 81 whose base is connected back through a conductor 421 to the alarm output signal of the over temperature sensor 35. For a more detailed description of the construction and operation of the over temperature sensor, reference is made to the above-identified copending U.S. application Ser. No. 131,648. Briefly, however, it can be said that the over-temperature sensor circuit 35 is comprised by a thermistor shown at 411 which is positioned to sense the temperature in the vicinity of the inductive heating coil $L_3$, and upon an over temperature condition being sensed, serves to develop an alarm output signal that operates the inhibiting transistor 81 and shuts down the inductive cooking unit chopper-inverter power supply by turning off the zero point switching SCR 21.

The over-temperature sensor circuit 35 is supplied through a voltage dropping resistor 48 connected in series circuit relationship with a filter capacitor 410 across the power supply terminals 15 and 16. A zener diode 409 is connected across the filter capacitor 410 for regulating the DC excitation potential for the over temperature circuit. This DC excitation potential is developed across the low voltage power supply terminals 15B and 16, and is supplied across the thermistor temperature sensor 411 through an adjustable resistor 412 for variably controlling the sensitivity or threshold operating level of the over temperature circuit. The juncture of the variable resistor 412 and thermistor 411 is connected to the anode gate of a PUT with the capacitor 413 being connected across the variable resistor 412 for stabilization purposes. The anode of the PUT is connected to the juncture point of a pair of voltage dividing resistors 416 and 417 connected across the low voltage over temperature circuit power supply terminals 15B and 16. The cathode of the PUT 414 is connected through a cathode load resistor 415 to the negative terminal 416 of the low voltage over temperature circuit power source. Alarm output signals from the over temperature circuit are derived across the load resistor 415 and supplied over conductor 421 to the base of inhibiting transistor 81.

With the above-described arrangement, when an over-temperature condition occurs in the inductive heating assembly, the thermistor 411 which has a negative temperature coefficient will drive the anode gate of PUT 414 sufficiently positive with respect to its cathode to cause PUT 414 to break down and conduct. Upon this occurrence, a positive going enabling potential will be applied to the base of the inhibiting transistor 81 across conductor 421 from load resistor 415 and cause inhibiting transistor 81 to shut down the inductive cooking unit power supply by turning off zero switching SCR 21 in the above-described manner. In order to reset the over temperature circuit 35 after it has caused a shut down of the inductive cooking unit power supply in the above-described manner, the zero fixed contact of selector switch $S_2$ is connected back through a conductor 408 to the juncture of the voltage divider resistors 416 and 417. Upon the movable contact of the power level selector switch $S_2$ being moved to the zero fixed contact, it will be seen that the juncture of the voltage dividing resistors 416 and 417 will be clamped to the potential of the negative supply terminal bus 16 thereby causing PUT 414 to be turned-off. Thereafter, power level selector switch $S_2$ may be moved to any other of its fixed contacts where it is designed that the inductive cooking unit power supply circuit operate, and the over-temperature control circuit 35 will remain in the off condition provided that the over temperature condition which originally caused the circuit to operate, has been corrected or allowed to cool. It should be noted at this point that the same power level selector switch $S_2$ upon being switched to the zero fixed contact point will cause turn-on of the inhibiting transistor 85 due to the positive polarity turn-on potential supplied across resistor 312 from the voltage dividing resistors 313 and 314. As stated earlier turn-on of the inhibiting transistor 85 will cause turn-off of the zero point switching SCR 21 which in turn will remove power from the low voltage pan safety control power terminals 15 and 16B thereby causing this circuit to be de-energized and turning-off the latching SCR 204 in the event that SCR has been rendered conductive by an alarm output from the pan safety control circuit 30. Hence, the actuation of the single common power level selector switch $S_2$ to its zero (0) fixed contact serves to reset to their normal (off) conditions both the pan safety control circuit 30 and the over-temperature control circuit 35 in the event either one or both of the circuits has been actuated in the above-described manner.

Figure 4A:
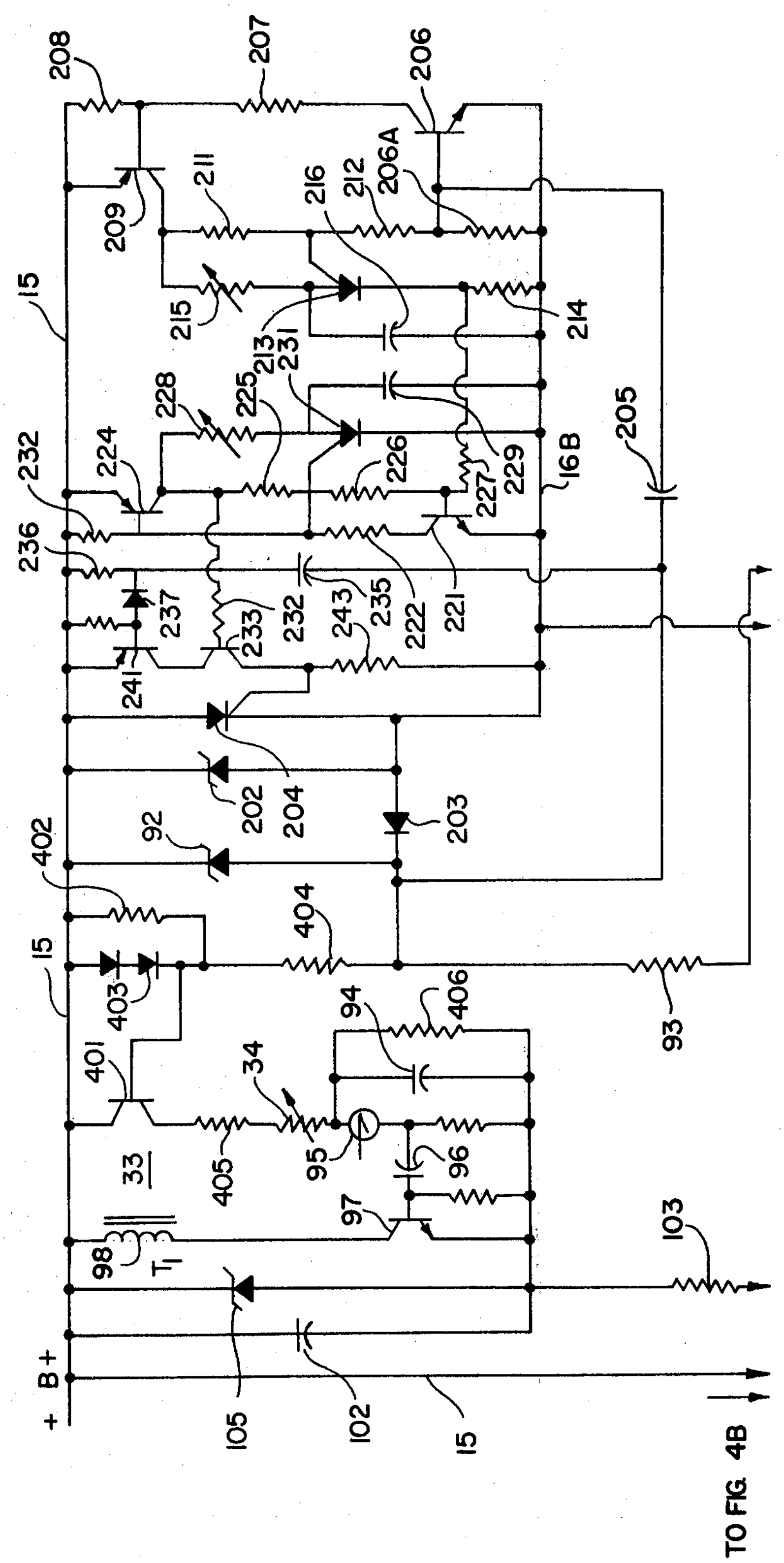
FIGS. 4A and 4B comprise a detailed schematic circuit diagram of a higher power model (230v.) of the apparatus and which includes an improved gating circuit for the chopper-inverter.
Figure 4B:
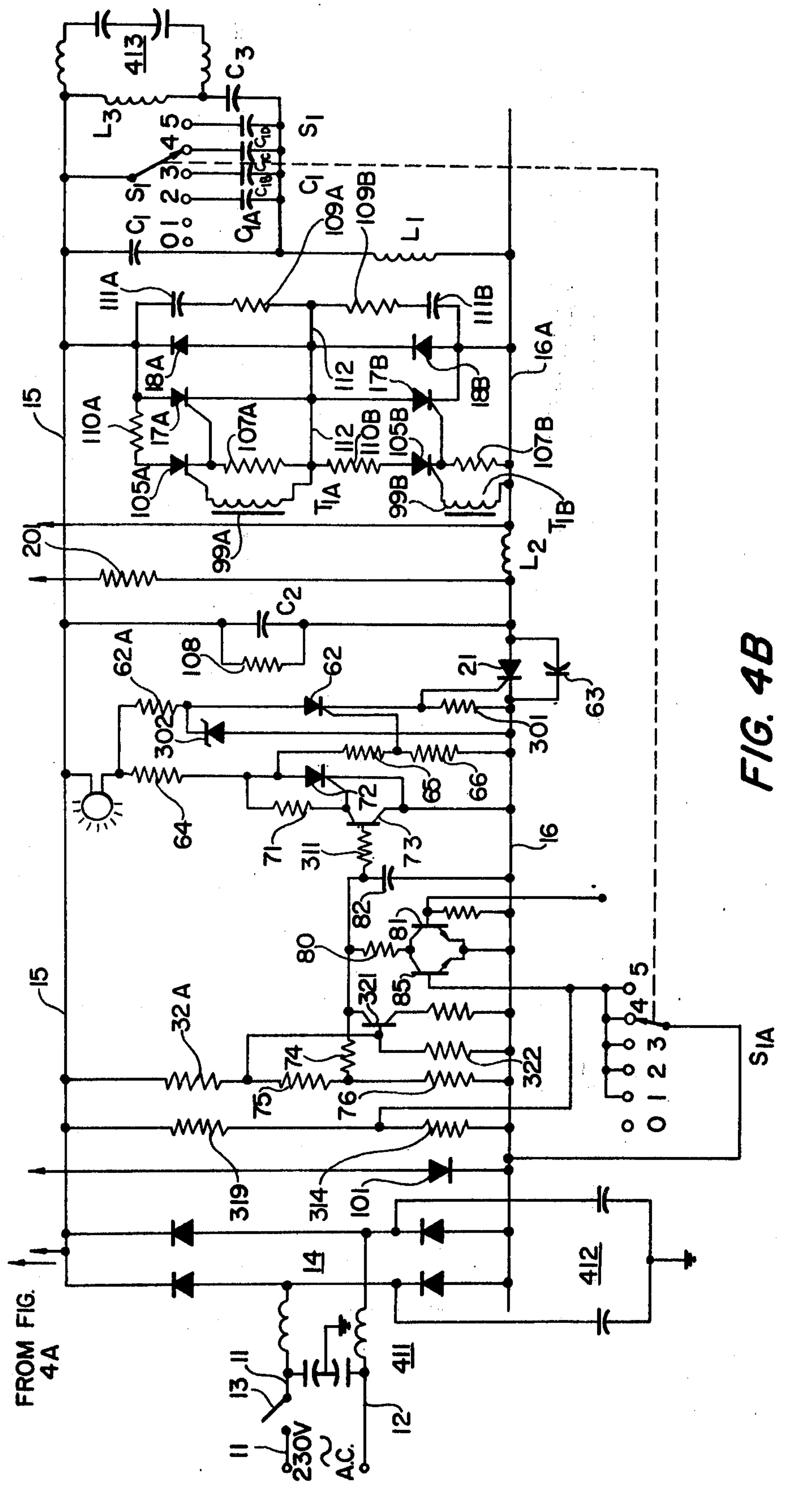

FIGS. 4A and 4B of the drawings comprise a detailed, schematic circuit diagram of a second embodiment of an induction cooking unit power supply system constructed in accordance with the invention. The embodiment of the invention shown in FIGS. 4A and 4B is designed for operation at higher power levels than the embodiment shown in FIGS. 2A and 2B. For example, while the FIGS. 2A and 2B circuit is designed primarily for operation with 115 volt, 15–20 amp. alternating current power source, the circuit shown in FIGS. 4A and 4B is designed for operation with a 230 volt, 20–30 amp. alternating current power source and, of course, the parameters of the various circuit components are proportioned for operation at this different, higher level. One of the primary distinguishing features of the circuit shown in FIGS. 4A and 4B is the use of two (or more where required) series connected SCRs 17A and 17B which are connected in series circuit relationship across the power supply terminals 15 and 16A. Each of SCRs 17A and 17B has an inverse, parallel connected feedback diode 18A and 18B, respectively, connected across it along with its own respective snubber circuit comprised by serially connected capacitors 11A and resistor 109A and capacitor 111B and resistor 109B, respectively. The cathode of SCR 17A and the anode of SCR 17B are connected by a common conductor 112 to the juncture of the anode of feedback diode 18A and the cathode of feedback diode 18B and the juncture of the snubbing resistors 109A and 109B. The gating electrodes of SCRs 17A and 17B are connected to respective gating resistors 107A and 107B which, in turn, are connected in the cathodes of respective, low voltage, pilot gating SCRs 105A and 105B whose anodes are connected through the respective voltage dividing resistors 110A and 110B to the power supply terminal 15 and common connecting conductor 112, respectively. The control gates of the SCRs 105A and 105B are connected to respective, secondary windings 99A and 99B of the gating pulse transformer $T_1$ whose primary winding 98 is excited upon the NPN gating transistor 97 being rendered conductive. Upon this occurrence, positive polarity gating pulses will be induced in the secondary windings 99A and 99B of the pulse transformer $T_1$ which cause turn-on of the low voltage, pilot gating SCRs 105A and 105B. The secondary windings 99A and 99B may be shunted by reverse connected diodes (not shown) which limit any flyback in voltage generated by the transformer $T_1$. The series connected voltage dividing resistors 110A, 107A, 110B and 107B assure simultaneous turn-on of the pilot gating SCRs 105A and 105B so that appropriate polarity gating pulses of sufficient strength are applied simultaneously to the control gates of the power rated chopping SCRs 17A and 17B causing these devices to turn-on simultaneously. Thereafter, the chopper-inverter operates in precisely the same manner as explained earlier in connection with the lower voltage form of the power supply circuit.

Another important feature of construction of the circuit shown in FIG. 4A is the design of the trigger generator circuit 33 for supplying trigger pulses to the base of the gating transistor 97. The FIG. 4A trigger generator circuit 33 is again comprised by a silicon unilateral switch 95 which is a voltage sensitive switch for sensing the build up in voltage across a timing capacitor 94 that is supplied through a variable resistor 34 and series connected fixed resistor 405 upon a triggering PNP junction transistor 401 being turned on. The PNP transistor 401 has its emitter-collector connected in series circuit relationship with the fixed resistor 405, variable resistor 34 and timing capacitor 94 across the stable, low voltage (−20 volts) direct current power source comprised by capacitor 102 and regulating zener diode 105 supplied through voltage dividing resistor 103 and diode rectifier 101 with the series connected capacitor 102, resistor 103 and diode rectifier 101 being connected across the power supply terminals 15 and 16 that are supplied directly with the full wave rectified output of full wave rectifier 14. By this arrangement, it will be seen that upon turn-on of PNP transistor 401, the pre-established low voltage, direct current excitation potential existing across capacitor 102 will be applied directly across the resistance-capacitance timing circuit comprised essentially by the resistors 405, 95 and capacitor 94. In this manner full operating voltage for assuring proper operation of the timed triggering of SUS 95 is provided even in the valley of the ripple of the full wave rectified potential appearing across power supply terminals 15 and 16 thereby assuring proper production of triggering pulses even at very low power supply potentials.

The improved trigger pulse generator 33 is completed by a set of series connected voltage dividing resistors 402 and 404 which are connected in series circuit relationship with the voltage dividing resistor 93 between the power supply terminal 16A (right hand side of filter conductor $L_2$) and power supply terminal 15. A set of series connected diode rectifiers 403 are connected across the voltage dividing resistor 402 for limiting or clamping the potential supplied to the base of the triggering PNP transistor 401 to a maximum of two diode drops. At the end of the $t_1$ commutation interval following termination of conduction through the SCR and diode pairs 17A, 18A and 17B and 18B, respectively, the terminal voltage of power supply terminal 16A will swing negatively during the timing period $t_2$. Upon this occurrence, an enabling potential will be applied to the base of the trigger PNP transistor 401 causing this transistor to turn-on. Turn-on of transistor 401 will result in applying the full 20 volt DC potential across filter capacitor 102 to the RC timing network comprised by resistors 405, 34 and capacitor 94. Upon the voltage of capacitor 94 building up to the threshold level of SUS 95, SUS 95 breaks over and conducts to produce a gating signal pulse that is applied across resistance-capacitance coupling network comprised in part by the capacitor 96 to the base of the NPN gating transistor 97. As a consequence, NPN transistor 97 turns-on and produces a gating signal pulse in the primary winding 98 that in turn produces turn-on gating pulses in the respective secondary windings 99A and 99B resulting in turn-on of the pilot SCRs 105A and 105B in the previously described manner. A bleeder resistor 406 is connected across a timing capacitor 94 to assure complete dissipation of any charge on the timing capacitor during the succeeding $t_1$ commutation intervals while trigger transistor 401 is turned-off. In this manner precise control over the timing of turn-on of the SUS 95 and hence repetition rate of the resulting trigger pulses, is maintained.

Another distinguishing feature of the FIGS. 4A and 4B circuit worthy of mention is the inclusion of suitable radio frequency filters such as the inductive $\pi$ filter 411 and capacitive $\pi$ filter 412 connected to the power supply conductors 11 and 12 at their point of connection to the full wave bridge rectifier 14. By the provision of these radio frequency filter arrangements, which may be entirely conventional in construction and operation, further suppression of undesired radio interference effects is achieved by preventing or eliminating any radio frequency currents that otherwise might leak out over the power supply conductors 11 and 12. Additionally, a further radio frequency $\pi$ filter arrangement 413 may be connected at the terminals which connect to the inductive heating coil $L_3$. Harmonic components of the current supplied to coil $L_3$ are suppressed and by passed capacitively to the chassis ground for the equipment. By the provision of the inductive $\pi$ filter 413 connected in this manner maximum suppression of radio frequency emissions from the unit can be achieved.

From the foregoing description it will be appreciated that the invention makes available a new and improved inductive cooking apparatus power supply and pan safety control therefore which senses whether a particular pan or other cooking vessel placed over the inductive heating coil of the apparatus, is fabricated from a suitable ferromagnetic material, and, if not, automatically shuts-down the apparatus until the pan is removed. The pan safety control can be reset readily by an operator of the inductive cooking unit, but by reason of its design, it helps to school the operator (who may be an inexperienced housewife) so that she recognizes that particular pans fabricated from highly conductive material such as aluminum and copper cannot be used safely with the inductive cooking unit. Further, the pan safety control is operative to protect the inductive cooking unit power supply whether the highly conductive pan of aluminum, copper, etc. is placed over the inductive cooking coil after the unit is operating, or whether it is placed there before the inductive cooking unit is turned on. Additionally, the improved inductive cooking unit power supply includes an over-temperature cutoff control and a common reset switching mechanism which will serve to reset not only the over-temperature control circuit, but also will reset the pan safety control in the event that either one or both of these controls have been actuated. An improved gating circuit and zero point switching inhibit and control circuit constructions also are described which assure proper gating and operation of the zero point switch employed in the inductive cooking unit power supply along with a high power (230v.) version of the apparatus and all of these features are included in all overall power supply circuit which is relatively simple to construct, operate and service, and is of relatively low cost. Having described two embodiments of a new and improved induction cooking unit power supply system and pan safety control circuit therefore constructed in accordance with the invention, it is believed obvious that other modifications and variations of the invention will be suggested to those skilled in the art in the light of the above teachings. It is therefore to be understood that changes may be made in the particular embodiments of the invention described which are within the full intended scope of the invention as defined by the appended claims.

What is claimed is:

1. A gating circuit for a thyristor power supply system having high voltage power supply terminal means, means for deriving a low voltage unidirectional self-excitation potential from the high voltage power supply terminal means, timing circuit charging means supplied by said low voltage excitation potential, voltage responsive switching means, gate controlled semiconductor switching means connected intermediate said low voltage excitation potential and said timing circuit charging means for controlling application of said low voltage excitation potential to said timing circuit charging means, the control gate of said semiconductor switching means being coupled to and controlled by the voltage across the thyristor power supply for controlling supply of the low voltage excitation potential to the timing circuit charging means, said voltage responsive switching means being rendered conductive upon the voltage across said timing circuit charging means attaining a preset value, a constant current, high voltage gate controlled semiconductor switching means having a relatively flat current vs. voltage conducting characteristic having its load terminals connected to and supplied by said high voltage power supply terminals, the control gate of said constant current high voltage switching device being coupled to and controlled by said voltage responsive switching means, and gating signal output circuit means connected in series circuit relationship with the load terminals of said constant current high voltage semiconductor switching means, said gating signal output circuit means being adapted for connection to the control gate of a gate controlled thyristor of large power rating comprising a part of the thyristor power supply.

2. A gating circuit according to claim 1 wherein said constant current high voltage gate controlled semiconductor switching means comprises a high voltage switching transistor having a relatively flat current vs. voltage conducting characteristic with the emitter-collector of the transistor being connected in series with the gating signal output circuit means across the high voltage power supply terminal means and the base of the transistor being connected to the voltage responsive switching means.

3. A gating circuit according to claim 2 wherein the voltage responsive switching means comprises a programmable unijunction transistor device and further including means for varying the charging time constant of said timing circuit charging means.

4. A gating circuit according to claim 2 wherein the voltage responsive switching means comprises a silicon unilateral switch device and further including means for varying the charging time constant of said timing circuit charging means.

5. A gating circuit according to claim 2 wherein the gating signal output circuit means comprises an isolating transformer having its primary winding connected in the emitter-collector circuit of the high voltage switching transistor and having its secondary winding adapted to be connected to the control gate of a thyristor of large power rating comprising a part of the thyristor power supply.

6. A gating signal generator for gate controlled thyristors comprising a programmable uni-junction transistor having an anode, an anode-gate and a cathode, a timing capacitor connected in parallel circuit relationship across the anode-cathode of the programmable uni-junction transistor, output circuit means coupled in series circuit relationship with the programmable uni-junction transistor for supplying a gating-on signal to the control gate of a gate controlled thyristor, adjustable charging resistor means connected in common to the anode and to the timing capacitor, biasing resistor means connected across the series connected charging resistor and programmable uni-junction transistor and having an intermediate point connected to the anode-gate of the programmable uni-junction transistor, and supply terminal means connected across the biasing resistor means for supplying the gating signal generator with a low voltage direct current excitation potential.

7. A gating signal generator according to claim 6 further including enabling means connected in circuit relationship with said timing capacitor for initiating timing operation of said timing capacitor and load condition sampling means coupled to and controlling operation of said enabling means.

8. A gating signal generator according to claim 7 wherein said load condition sampling means includes differentiating circuit means for deriving a differentiated output electric control timing signal indicative of the load operating conditions.

9. A gating signal generator according to claim 8 wherein the enabling means comprises transistor means having its emitter-collector connected in series-circuit relationship with the parallel connected biasing resistor means and series connected charging resistor and timing capacitor and programmable uni-junction transistor, and having its base connected to the output from the load condition sampling means.

* * * * *